(12) United States Patent
Saitoh et al.

(10) Patent No.: US 8,039,887 B2
(45) Date of Patent: Oct. 18, 2011

(54) NON-VOLATILE SEMICONDUCTOR STORAGE DEVICE AND METHOD FOR MANUFACTURING THE SAME

(75) Inventors: Masumi Saitoh, Yokohama (JP); Ken Uchida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/773,967

(22) Filed: May 5, 2010

(65) Prior Publication Data
US 2010/0213533 A1  Aug. 26, 2010

Related U.S. Application Data

(63) Continuation of application No. 11/859,142, filed on Sep. 21, 2007, now Pat. No. 7,737,486.

(30) Foreign Application Priority Data

Dec. 22, 2006 (JP) ................................. 2006-345968

(51) Int. Cl.
*H01L 29/788* (2006.01)
(52) U.S. Cl. ................. 257/315; 257/316; 257/E29.129; 257/E29.16
(58) Field of Classification Search .......... 257/314–317, 257/E29.129, E29.154, E29.16
See application file for complete search history.

(56) References Cited

U.S. PATENT DOCUMENTS

| 6,940,089 B2 | 9/2005 | Cheng et al. |
| 7,180,143 B2 | 2/2007 | Kanegae et al. |
| 2004/0217430 A1* | 11/2004 | Chu ............................... 257/410 |
| 2005/0269621 A1 | 12/2005 | Forbes |
| 2006/0043463 A1 | 3/2006 | Liu et al. |
| 2007/0173020 A1* | 7/2007 | Ozawa et al. ................. 438/257 |

FOREIGN PATENT DOCUMENTS
JP  2005-79559  3/2005

OTHER PUBLICATIONS

R. Arghavani, et al., "Strain Engineering in Non-Volatile Memories", Semiconductor International, vol. 4, Apr. 1, 2006, 6 Pages.
Ken Uchida, et al., "Physical Mechanisms of Electron Mobility Enhancement in Uniaxial Stressed MOSFETs and Impact of Uniaxial Stress Engineering in Ballistic Regime", International Electron Devices Meeting (IEDM) Technical Digest, 2005, 4 Pages.

(Continued)

*Primary Examiner* — Matthew E Warren
(74) *Attorney, Agent, or Firm* — Oblon, Spivak, McClelland, Maier & Neustadt, L.L.P.

(57) ABSTRACT

A non-volatile semiconductor storage device includes: a semiconductor substrate; a source region and a drain region formed in the semiconductor substrate so as to be separated from each other; a first insulating film formed between the source region and the drain region, on the semiconductor substrate; a floating electrode formed on the first insulating film and including a semiconductor conductive material layer having extension strain; a second insulating film formed on the floating electrode; and a control electrode formed on the second insulating film. The extension strain of the floating electrode becomes gradually small as the location advances from the second insulating film toward the first insulating film, and the floating electrode has extension strain of 0.01% or more at an interface between the floating electrode and the second insulating film, and has extension strain less than 0.01% at an interface between the floating electrode and the first insulating film.

20 Claims, 8 Drawing Sheets

OTHER PUBLICATIONS

M.V. Fischetti, et al., "Band Structure, Deformation Potentials, and Carrier Mobility in Strained Si, Ge, and SiGe Alloys", American Institute of Physics, 1996, pp. 2234-2252.

S. Pidin, et al., "MOSFET Current Drive Optimization Using Silicon Nitride Capping Layer for 65-nm Technology Node", Symposium on VLSI Technology Digest of Technical Papers 2004, pp. 54-55.

* cited by examiner

NON-VOLATILE SEMICONDUCTOR STORAGE DEVICE AND METHOD FOR MANUFACTURING THE SAME

CROSS-REFERENCE TO RELATED APPLICATION

This application is a continuation application of U.S. Ser. No. 11/859,142 filed Sep. 21, 2007, which is based upon and claims the benefit of priority from prior Japanese Patent Application No. 2006-345968 filed on Dec. 22, 2006 in Japan, the entire contents of both of which are incorporated herein by reference.

BACKGROUND OF THE INVENTION

1. Field of the Invention

The present invention relates to a non-volatile semiconductor storage device and a method for manufacturing the device.

2. Related Art

As for the non-volatile semiconductor storage device for which electrical writing and erasing can be conducted and which can retain information even if power supply is cut off, it is being developed as a storage medium used in portable information devices, aiming at low voltage driving and a larger capacity. As the non-volatile semiconductor storage device that is the main stream at the present time, there is the flash memory which retains information by storing electric charge in a floating electrode formed of polysilicon.

The flash memory includes, for example, a p-type silicon substrate, a tunnel insulating film formed on the silicon substrate, a floating electrode formed of polysilicon on the tunnel insulating film, a control insulating film formed on the floating electrode, a control electrode formed of polysilicon on the control insulating film, a channel region located in the silicon substrate right under the tunnel insulating film, and a source region formed of $n^+$-type silicon and a drain region formed of $n^+$-type silicon disposed in the silicon substrate so as to be opposed to each other with the channel region between. This structure can be regarded as a structure obtained from an n-channel field effect transistor having a source region and a drain region in a silicon substrate and a control electrode as three terminals by replacing a gate insulating film under the control electrode with a multilayer structure of a control insulating film, a floating electrode and a tunnel insulating film. Since the floating electrode is electrically insulated from the silicon substrate and the control electrode by the tunnel insulating film and the control insulating film, it becomes possible for the floating electrode to store the electric charge.

Writing into the memory is implemented by applying a positive voltage between the silicon substrate and the control electrode and thereby injecting electrons from the channel region into the floating electrode by means of the tunnel effect in quantum mechanics. On the other hand, erasing from the memory is implemented by applying a negative voltage between the silicon substrate and the control electrode and thereby emitting electrons from the floating electrode into the channel region by means of the tunnel effect in quantum mechanics. In readout from this memory, it is determined whether information is "0" or "1" by detecting a difference caused in a current flowing from the source region to the drain region between a state in which electrons are injected into the floating electrode (writing is performed) and the floating electrode is charged to negative and a state in which electrons are not injected (after erasing has been performed), when voltages are applied respectively between the source region and the drain region and between the source electrode and the control electrode.

For lowering the error rate at the time of readout, it is desirable that the number of electrons in the floating electrode greatly differs between after writing and after erasing (in other words, the number of electrons is as large as possible and the number of electrons is as small as possible). However, there is a problem that the number of electrons in the floating electrode after writing is limited by a phenomenon that electrons injected from the channel region into the floating electrode at the time of writing are passed through the control insulating film by the tunnel effect and emitted to the control electrode.

For solving this problem, a technique of increasing the voltage (write voltage) applied to the control electrode at the time of writing, or a technique of increasing the thickness of the control insulating film is also conceivable. If the former cited technique is used, power dissipation in memory operation increases. If the latter cited technique is used, it becomes difficult to make the memory cell finer (increase the capacity of the memory).

As a different technique of increasing the number of electrons in the floating electrode after writing and improving the write characteristics, a technique of applying extension strain to the floating electrode has been proposed in recent years (for example, see JP-A 2005-79559 (KOKAI), and R. Arghavani, V. Banthia, M. Balseanu, N. Ingle, N. Derhacobian, and S. E. Thompson, "Strain Engineering in Non-Volatile Memories," Semiconductor International, vol. 4 (2006)). If extension strain is applied to the floating electrode formed of polysilicon, conduction band bottom energy of polysilicon falls. According to calculation results of dependence of the conduction band bottom energy of silicon upon the extension strain quantity (see, for example, K. Uchida, T. Krishnamohan, K. C. Saraswat, and Y. Nishi, "Physical Mechanisms of Electron Mobility Enhancement in Uniaxial Stressed MOSFETs and Impact of Uniaxial Stress Engineering in Ballistic Regime," Technical Digest of International Electron Devices Meeting, pp. 135-138 (2005)), the conduction band bottom energy of silicon falls by approximately 0.025 eV when the extension strain quantity is 0.2%.

If the conduction band bottom energy of the floating electrode formed of polysilicon falls (i.e., the work function increases), the bottom energy difference of the conduction band (tunnel barrier height) between the control insulating film and the floating electrode also increases. Therefore, the phenomenon that electrons are passed through the control insulating film from the floating electrode and emitted to the control electrode is suppressed, and the write characteristics are improved. By using this technique, it is prevented that the power dissipation increases and making the memory cell finer becomes difficult.

If this technique is used, the erase characteristics are conversely deteriorated. Because since the conduction band bottom energy difference (tunnel barrier height) between the floating electrode and the tunnel insulating film also increases as a result of an increase of the work function of polysilicon caused by extension strain, the number of electrons passed through the tunnel insulating film from the floating electrode and emitted to the channel region at the time of erase decreases. If the number of electrons in the floating electrode after erasing is also increased due to degradation of erase characteristics even if the number of electrons in the floating electrode after writing is increased due to improvement of the write characteristics, the difference in threshold voltage difference of a transistor between after writing and after erasing does not change so greatly and eventually the error rate at the time of memory readout is not improved.

In the conventional flash memory, means for improving the write characteristics without degrading the erase characteristics has not been implemented as described above.

SUMMARY OF THE INVENTION

According to an embodiment, there is provided a non-volatile semiconductor storage device comprising a memory element which includes: a semiconductor layer; a first insulating film formed on the semiconductor layer; a floating electrode formed on the first insulating film, and including a polysilicon carbon layer formed on the first insulating film and a polysilicon layer formed on the polysilicon carbon layer, the polysilicon layer and the polysilicon carbon layer storing electric charge; a second insulating film formed on the floating electrode; and a control electrode formed on the second insulating film.

DETAILED DESCRIPTION OF THE INVENTION

Hereafter, embodiments of the present invention will be described with reference to the drawings.

First Embodiment

Figure 1:
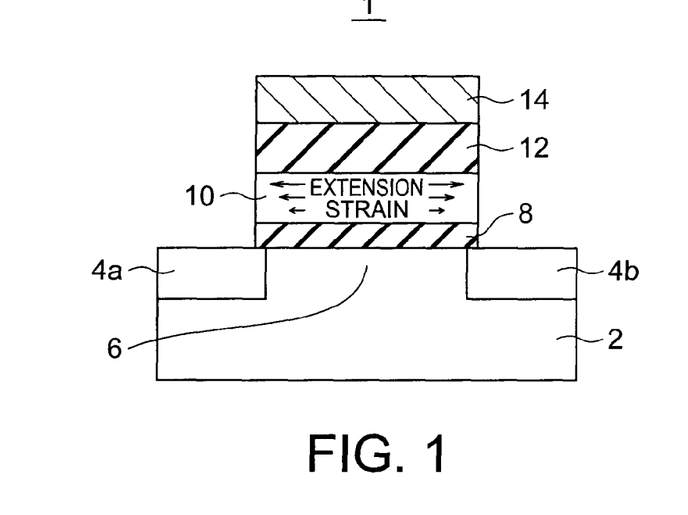
FIG. 1 is a sectional view of a memory element according to a first embodiment.

A non-volatile semiconductor storage device according to a first embodiment of the present invention includes, for example, a NAND cell having a plurality of memory elements which are series-connected. A section of a memory element is shown in FIG. 1. As shown in FIG. 1, a memory element 1 includes a $p^+$-type silicon substrate 2, an $n^+$-type source region 4a and a drain region 4b formed apart from each other in the $p^+$-type silicon substrate 2, a channel region 6 formed between the $n^+$-type source region 4a and the drain region 4b, a tunnel insulating film 8 which is formed on the channel region 6 and which can be tunneled by electrons in quantum mechanics, a floating electrode 10 which is formed on the tunnel insulating film 8 and which can store electrons, a control insulating film 12 formed on the floating electrode 10, and a control electrode 14 formed on the control insulating film 12.

As for materials of the tunnel insulating film 8 and the control insulating film 12, oxide silicon, oxy-nitride silicon, nitride silicon, and oxide hafnium can be mentioned. As for the material of the control electrode 14, polysilicon can be mentioned.

In the present embodiment, polysilicon is used as the material of the floating electrode 10. The floating electrode 10 formed of polysilicon has extension strain in the film surface direction. Its strain quantity is 0.01% or more at an interface between the floating electrode 10 and the control insulating film 12. There is no strain at an interface between the floating electrode 10 and the tunnel insulating film 8. The strain quantity becomes gradually small as the location advances from the control insulating film 12 toward the tunnel insulating film 8. In the present specification, "distortion quantity $\epsilon$" is defined as $\epsilon=(a-a_0)/a_0$ where $a_0$ is the crystal lattice distance in a strain-less state and "a" is the crystal lattice distance obtained after strain is applied. The distortion quantity $\epsilon$ is evaluated typically by Raman spectroscopy measurement. The "strain-less" means that the extension strain is less than 0.01%. It is desirable that the strain quantity at the interface between the floating electrode 10 and the control insulating film 12 (i.e., the maximum extension quantity in the floating electrode 10) is in the range of 0.2% to 2%. It is considered that if the strain quantity is 0.2% or more the conduction band bottom energy of the floating electrode 10 formed of polysilicon falls as compared with strain-less polysilicon by approximately 0.025 eV (nearly equal to thermal energy at the room temperature) and a significant write improvement effect is obtained as described later. Furthermore, it is considered that the upper limit of the strain quantity which can be applied without exerting a bad influence upon the element characteristics by generation of a defect or the like is approximately 2%.

Figure 2:
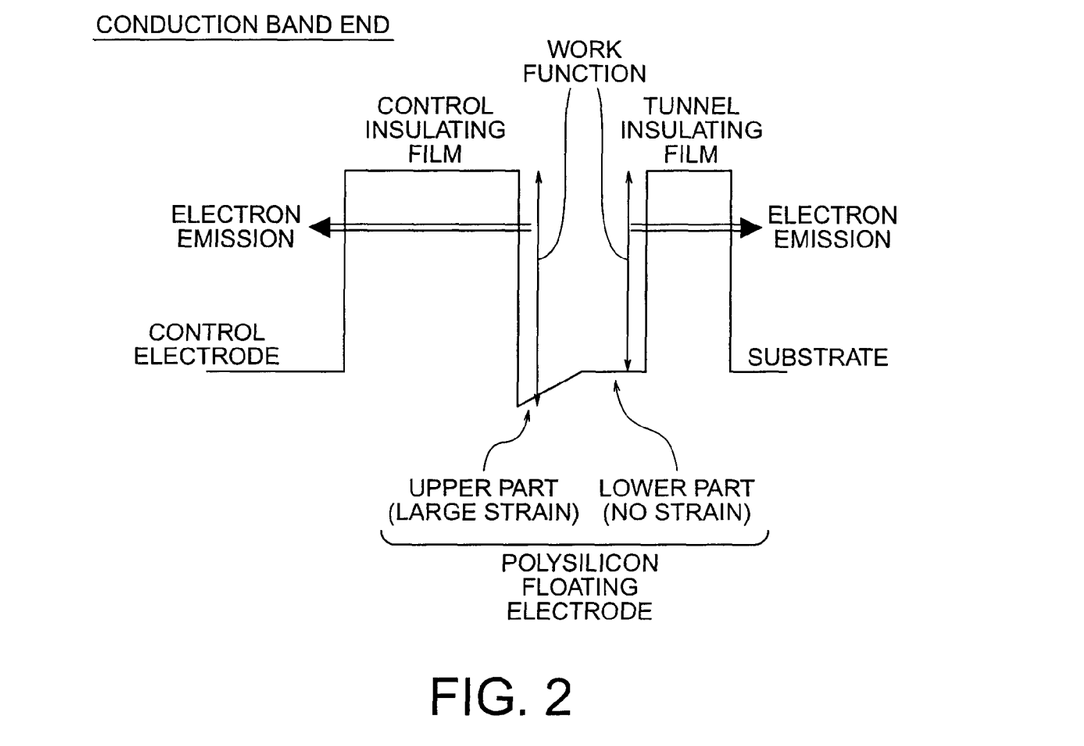
FIG. 2 is a diagram showing conduction band bottom energy in a section of the memory element according to the first embodiment in a direction perpendicular to a substrate.

FIG. 2 shows the conduction band bottom energy in a section in a direction perpendicular to the substrate in the memory element according to the present embodiment. Extension strain is applied to the floating electrode 10 formed of polysilicon. Its quantity becomes gradually smaller as the location advances from the control insulating film 12 toward the tunnel insulating film 8. Therefore, the work function of the floating electrode 10 formed of polysilicon becomes gradually lower as the location advances from the control insulating film 12 toward the tunnel insulating film 8.

Figure 3:
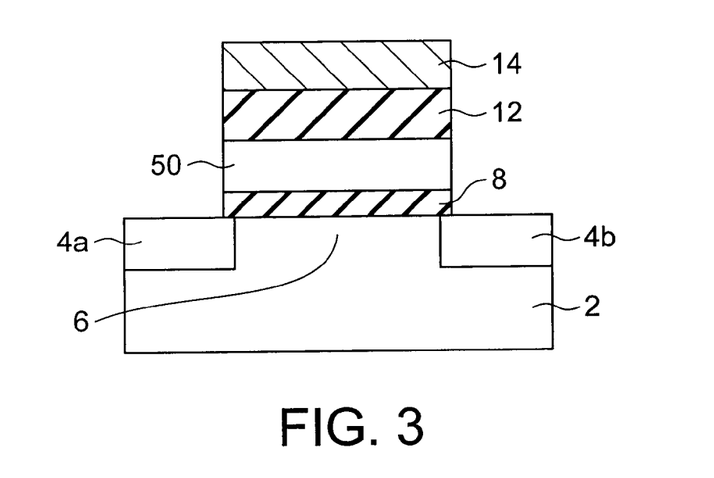
FIG. 3 is a sectional view of a memory element according to a comparative example 1.
Figure 4:
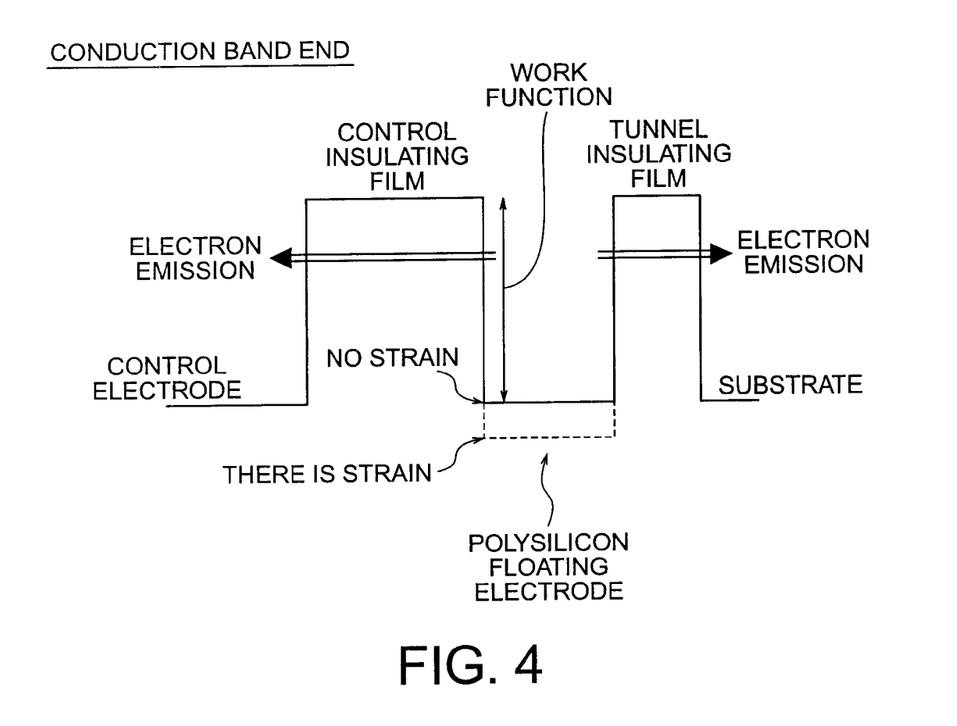
FIG. 4 is a diagram showing conduction band bottom energy in a section of the memory element according to the comparative example 1 in a direction perpendicular to a substrate.

As a comparative example 1 for the present embodiment, a memory element obtained from the memory element according to the present embodiment by replacing the floating electrode 10 formed of polysilicon having extension strain with a floating electrode 50 formed of strain-less polysilicon is fabricated. A section of this memory element is shown in FIG. 3. Conduction band bottom energy of a section in a section in a direction perpendicular to the substrate in the memory element according to the comparative example 1 is shown in FIG. 4. In FIG. 4, conduction band bottom energy in the case where strain in polysilicon which forms the floating electrode is constant is indicated by a dash line.

Polysilicon having extension strain is higher in work function than strain-less polysilicon (FIG. 4). As appreciated from FIGS. 2 and 4, therefore, the present embodiment becomes higher in tunnel barrier between the control insulating film and the floating electrode than the comparative example 1 on the control insulating film 12 side. As a result, the phenomenon that electrons are passed through the control insulating film 12 from the floating electrode 10 and emitted to the control electrode 14 at the time of writing is suppressed in the present embodiment, and the write characteristics are improved as compared with the comparative example 1. In other words, the threshold voltage after the writing becomes high.

On the other hand, in the present embodiment, the floating electrode 10 becomes polysilicon having a strain quantity which becomes negligibly small (a strain quantity less than 0.01%) at the interface between the floating electrode 10 and the tunnel insulating film 8. Therefore, the erase characteristics in the present embodiment become the same as those in the comparative example 1.

Therefore, the memory element according to the present embodiment does not change in threshold voltage after erasing from the comparative example 1, but becomes higher in threshold voltage after writing. In the present embodiment, therefore, the threshold voltage difference between after the writing and after the erasing increases, and the error rate at the time of memory readout can be improved as compared with the comparative example 1.

A memory element obtained by replacing the floating electrode in the memory element according to the present embodiment with a floating electrode formed of polysilicon having constant strain is used as comparative example 2. As compared with the comparative example 2, the memory element according to the present embodiment does not change in threshold voltage after writing, but becomes lower in threshold voltage after erasing. In the present embodiment, therefore, the threshold voltage difference between after the writing and after the erasing increases, and the error rate at the time of memory readout can be improved as compared with the comparative example 2.

According to the present embodiment, both the write characteristics and the erase characteristics can be improved as heretofore described. As a result, the readout error rate of the memory falls. Furthermore, since it is not necessary to increase the write voltage and increase the film thickness of the control insulating film, it becomes possible to lower the operation voltage (power dissipation) and make the memory cell finer.

A method for manufacturing the memory element 1 according to the present embodiment will now be described with reference to FIGS. 5 to 9.

Figure 5:
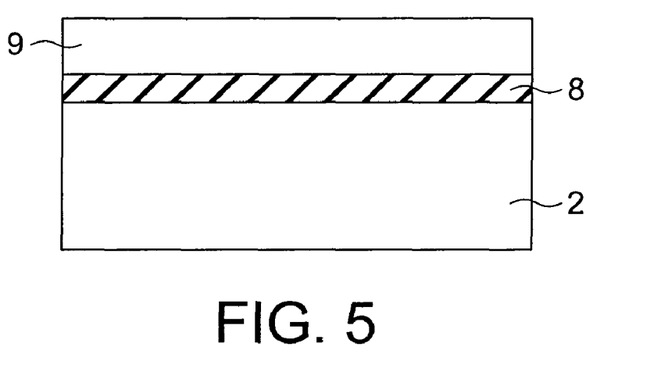
FIGS. 5 and 6 are sectional views showing a method for manufacturing the memory element according to the first embodiment.
Figure 6:
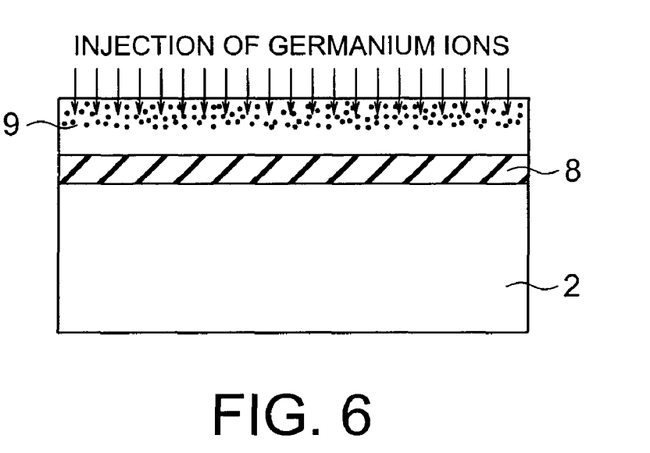
Figure 7:
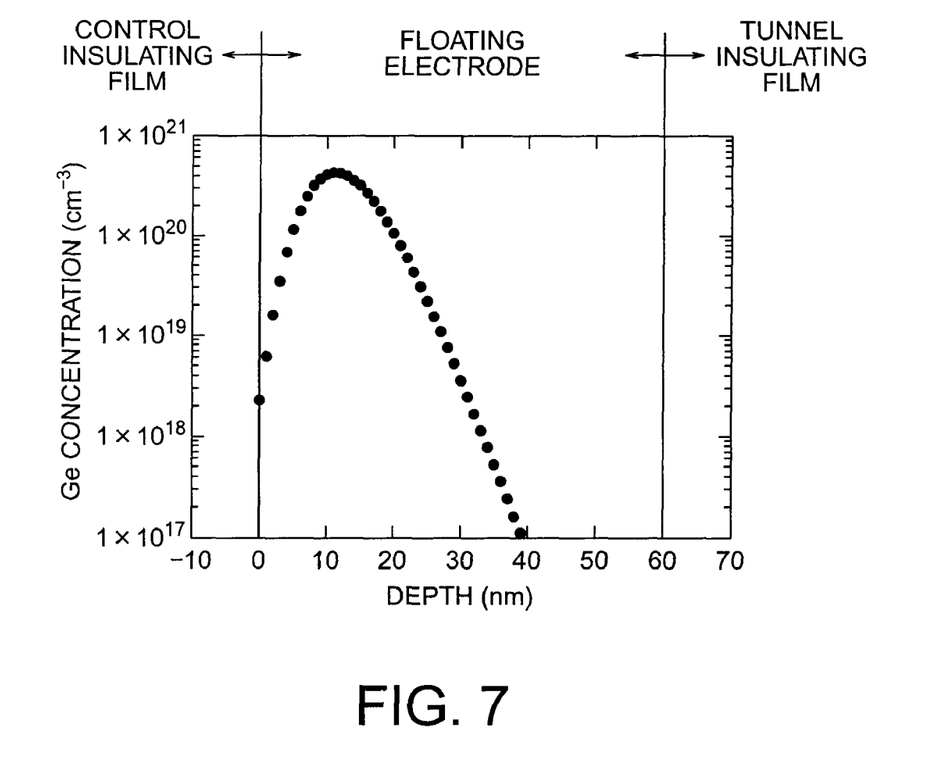
FIG. 7 is a diagram showing a calculation result of distribution of germanium ions in a floating electrode in the memory element according to the first embodiment.

First, the tunnel insulating film 8 and a polysilicon film 9 are formed successively on the p$^+$-type silicon substrate 2 as shown in FIG. 5. Subsequently, germanium ions are injected into an upper part of the polysilicon film 9 as shown in FIG. 6. The upper part of the polysilicon film 9 is non-crystallized by injecting germanium ions. For example, FIG. 7 shows a calculation result of a concentration profile of germanium ions in the depth direction of the polysilicon film 9 obtained when germanium ions are injected under the conditions that the polysilicon film 9 has a thickness of 60 nm, the acceleration voltage is 10 keV and the dose is $5\times10^{14}$ cm$^{-2}$. As appreciated from the calculation result shown in FIG. 7, it is possible to inject germanium ions into only the upper part of the polysilicon film 9.

Figure 8:
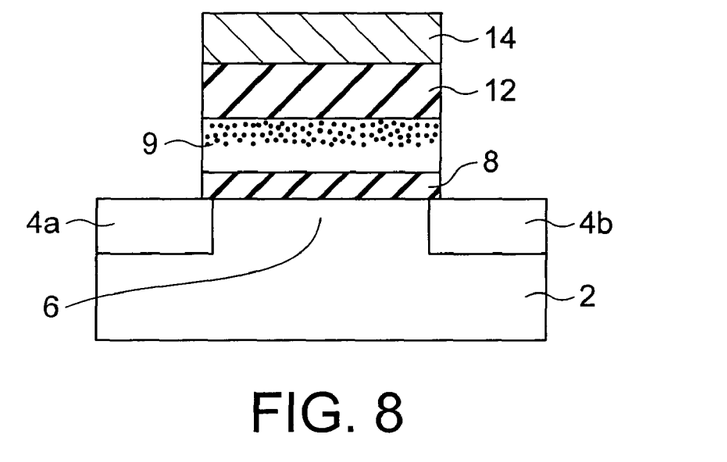
FIGS. 8 and 9 are sectional views showing a method for manufacturing the memory element according to the first embodiment.

Subsequently, as shown in FIG. 8, the control insulating film 12 and the control electrode 14 are deposited on the polysilicon film 9. A multilayer film formed of the control electrode 14, the control insulating film 12, the polysilicon film 9 and the tunnel insulating film layer 8 is patterned so as to take the'shape of a gate. Thereafter, the n$^+$-type source region 4a and drain region 4b are formed by using the control electrode 14 as a mask.

Figure 9:
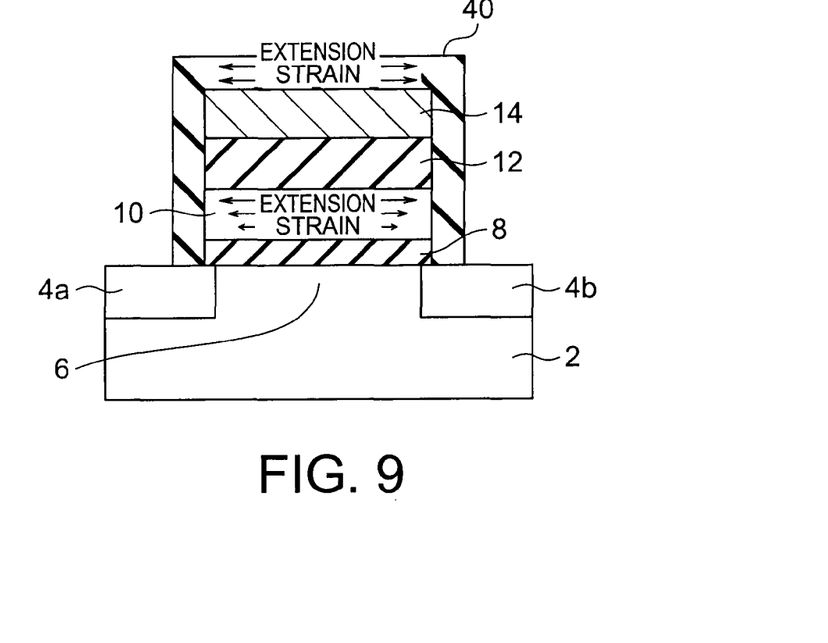

Subsequently, as shown in FIG. 9, a nitride film 40 having extension strain is deposited on the control electrode 14. Thereafter, heat treatment is conducted. As a result, the non-crystallized upper part of the polysilicon film 9 is crystallized. The extension strain in the nitride film 40 is transferred to the upper part of the polysilicon film 9, resulting in the floating electrode 10 having strain. Activation of the n$^+$-type source region 4a and drain region 4b is also conducted at the same time by the heat treatment.

Subsequently, the nitride film 40 is removed. After the removal of the nitride film 40 as well, the extension strain in the upper part of the floating electrode 10 is maintained. A structure in which the extension strain is large in the upper part of the floating electrode and there is little strain in the lower part is formed by these manufacturing processs. By the way, a technique of depositing a nitride film having extension strain on the control electrode and inducing extension strain in the control electrode in a MOS transistor for logical processing is known (see, for example, S. Pidin et al., Symposium on VLSI Technology, Digest of Technical Papers, pp. 54-55 (2004)).

Second Embodiment

Figure 10:
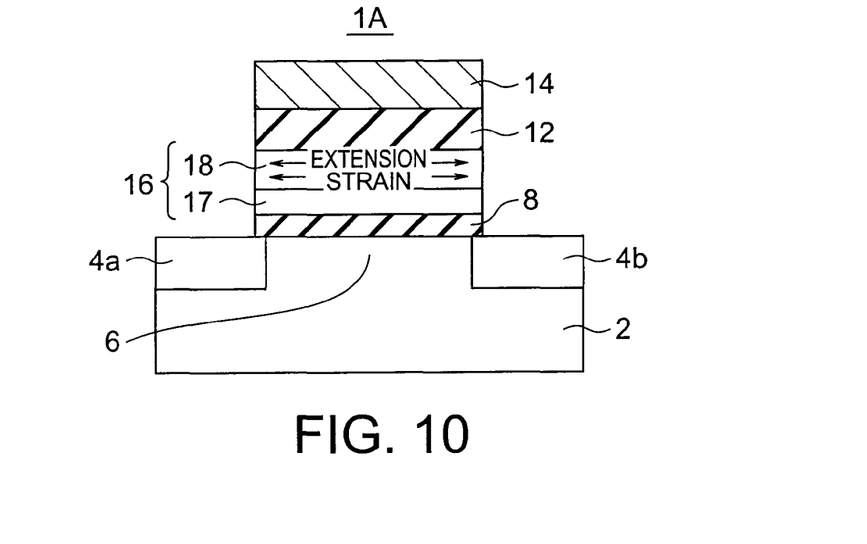
FIG. 10 is a sectional view of a memory element according to a second embodiment.

A non-volatile semiconductor storage device according to a second embodiment of the present invention will now be described with reference to FIGS. 10 and 11. The non-volatile semiconductor storage device according to the present embodiment includes, for example, a NAND cell having a plurality of memory elements which are series-connected. A section of a memory element 1A is shown in FIG. 10. The memory element 1A has a configuration obtained by replacing the floating electrode 10 in the memory element 1 according to the first embodiment shown in FIG. 1 with a floating electrode 16 of a laminated structure which includes a single crystal silicon germanium layer 17 having a strain quantity less than 0.01% formed on the tunnel insulating film 8 and a single crystal silicon layer 18 having extension strain of 0.01% or more formed on the single crystal silicon germanium layer 17.

In the present embodiment, it is desirable that the germanium content in the single crystal silicon germanium layer 17 is in the range of 5% to 50% and the extension strain quantity in the single crystal silicon layer 18 is in the range of 0.2% to 2%. As for the relation between the germanium content in the single crystal silicon germanium layer and the extension strain quantity in the single crystal silicon, see M. V. Fischetti et al., 3. Appl. Phys., vol. 80, no. 4, pp. 2234-2252 (1996).

Figure 11:
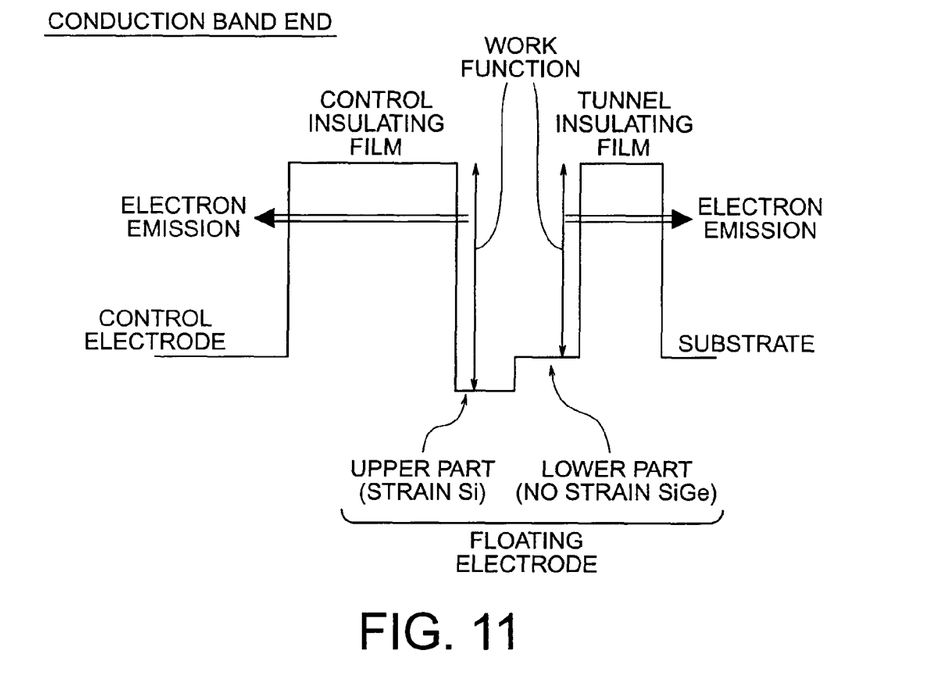
FIG. 11 is a diagram showing conduction band bottom energy in a section of the memory element according to the second embodiment in a direction perpendicular to a substrate.

FIG. 11 shows the conduction band bottom energy in a section in a direction perpendicular to the substrate in the memory element according to the present embodiment. As appreciated from FIG. 11, extension strain is applied to the single crystal silicon layer 18 which is the upper part of the floating electrode 16. Therefore, its work function is high as compared with strain-less silicon (or polysilicon). The lower part of the floating electrode 16 is the single crystal silicon germanium layer 17. Its work function is approximately equal to that of strain-less silicon (or polysilicon).

In the same way as the memory element according to the first embodiment, therefore, both the write characteristics and the erase characteristics can be improved. As a result, the readout error rate of the memory falls. Furthermore, since it is not necessary to increase the write voltage and increase the film thickness of the control insulating film, it becomes possible to lower the operation voltage (power dissipation) and make the memory cell finer.

A method for manufacturing the memory element according to the present embodiment will now be described with reference to FIGS. 12 to 15.

Figure 12:
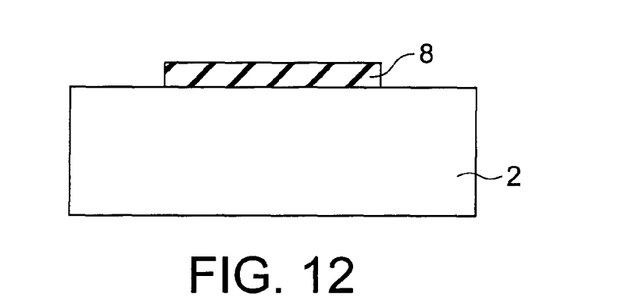
FIGS. 12 to 15 are sectional views showing a method for manufacturing the memory element according to the second embodiment.
Figure 13:
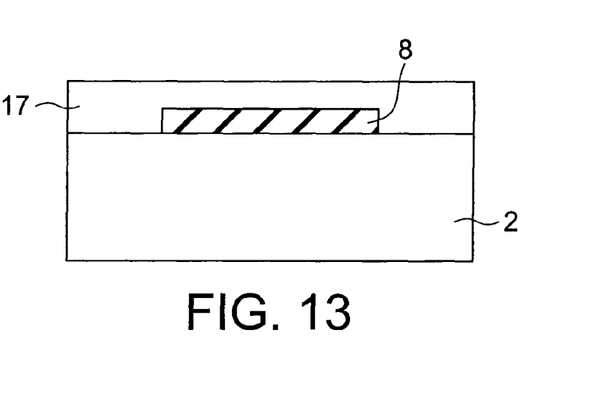

First, the tunnel insulating film 8 is formed on the $p^+$-type silicon substrate 2 and then patterning is conducted on the tunnel insulating film 8 to expose a part of the silicon substrate 2 as shown in FIG. 12. Subsequently, as shown in FIG. 13, selective epitaxial growth of the single crystal silicon germanium layer 17 on the exposed part of the silicon substrate 2 is caused. Thereupon, the single crystal silicon germanium layer 17 is formed on the tunnel insulating film 8 as well.

Figure 14:
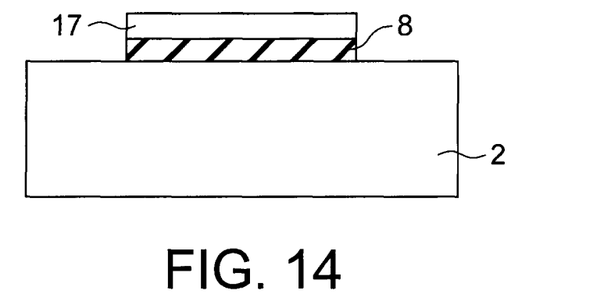
Figure 15:
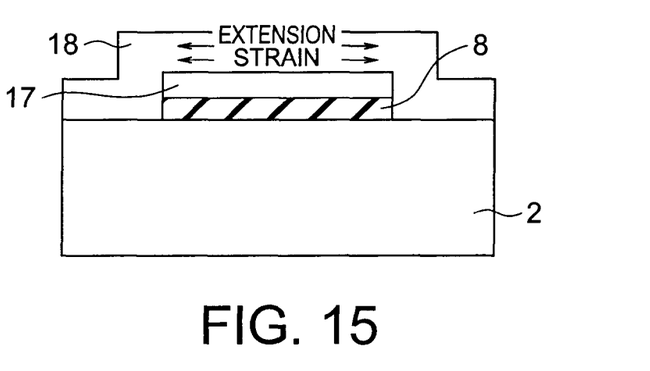

Subsequently, as shown in FIG. 14, etching is conducted on the grown single crystal silicon germanium layer 17. The strain in the single crystal silicon germanium layer 17 is reduced by this etching, resulting in a strain-less state. Subsequently, as shown in FIG. 15, epitaxial growth of the single crystal silicon layer 18 on the single crystal silicon germanium layer 17 is caused. The single crystal silicon layer 18 grown on the single crystal silicon germanium layer 17 having no strain has extension strain.

Subsequently, the control insulating film 12 and the control electrode 14 are deposited on the single crystal silicon layer 18. Then, a multilayer film formed of the control electrode 14, the control insulating film 12, the single crystal silicon layer 18, the single crystal silicon germanium layer 17, and the tunnel insulating film 8 is patterned so as to take the shape of a gate. Subsequently, the $n^+$-type source region 4a and drain region 4b are formed by using the control electrode 14 as a mask. The memory element having the structure shown in FIG. 10 is formed by these manufacturing processs.

Third Embodiment

Figure 16:
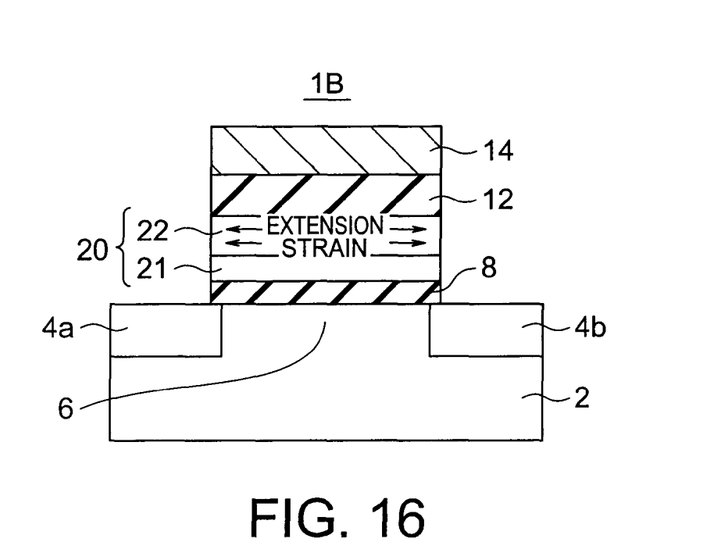
FIG. 16 is a sectional view of a memory element according to a third embodiment.

A non-volatile semiconductor storage device according to a third embodiment of the present invention will now be described with reference to FIGS. 16 and 17. The non-volatile semiconductor storage device according to the present embodiment includes, for example, a NAND cell having a plurality of memory elements which are series-connected. A section of a memory element 1B is shown in FIG. 16. The memory element 1B has a configuration obtained by replacing the floating electrode 10 in the memory element 1 according to the first embodiment shown in FIG. 1 with a floating electrode 20 of a laminated structure which includes a polysilicon carbon layer 21 formed on the tunnel insulating film 8 and a polysilicon layer 22 formed on the polysilicon carbon layer 21.

The polysilicon layer 22 has extension strain. Its strain quantity is 0.01% or more at an interface between the polysilicon layer 22 and the control insulating film 12, and its strain quantity is less than 0.01% at an interface between the polysilicon layer 22 and the polysilicon carbon layer 21. Its strain quantity becomes gradually smaller as the location advances from the control insulating film 12 toward the polysilicon carbon layer 21. It is desirable that the strain quantity at the interface between the polysilicon layer 22 and the control insulating film 12 (i.e., the maximum extension strain quantity in the polysilicon layer 22) is in the range of 0.2% to 2%. The carbon content in the polysilicon carbon layer 21 is in the range of 0.2% to 2%.

Figure 17:
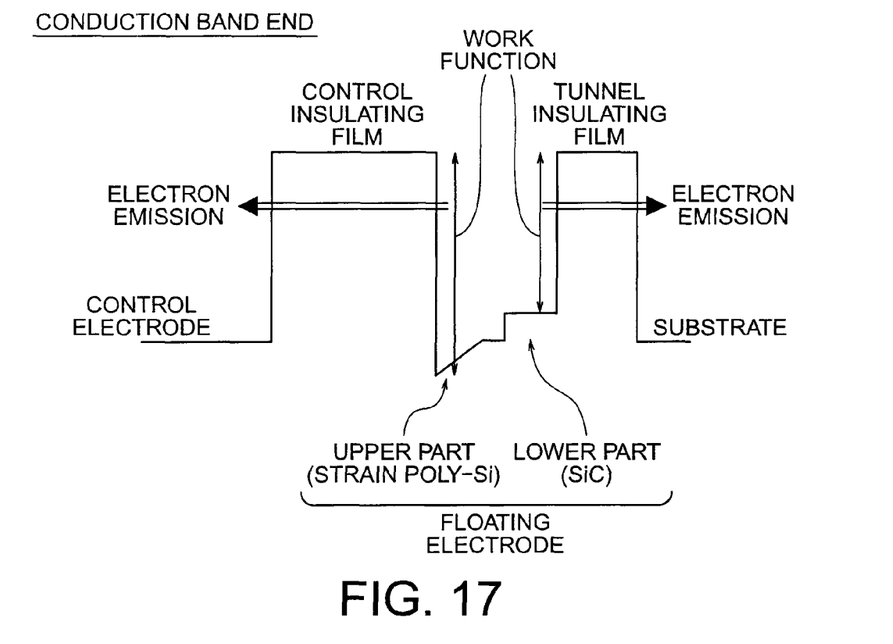
FIG. 17 is a diagram showing conduction band bottom energy in a section of the memory element according to the third embodiment in a direction perpendicular to a substrate.

FIG. 17 shows the conduction band bottom energy in a section in a direction perpendicular to the substrate in the memory element according to the present embodiment. As appreciated from FIG. 17, extension strain is applied to the polysilicon layer 22 which is the upper part of the floating electrode 20 (located on the control insulating film 12 side). Its work function is higher than that of the strain-less polysilicon. In the same way as the memory element according to the first embodiment, therefore, the write characteristics can be improved.

In addition, since the lower part (the tunnel insulating film 8 side) of the floating electrode 20 is the polysilicon carbon layer 21, its work function is lower than that of the strain-less polysilicon. On the tunnel insulating film 8 side, therefore, the tunnel barrier between the tunnel insulating film 8 and the floating electrode 20 is lower as compared with the case of the floating electrode formed of strain-less polysilicon. As a result, the phenomenon that electrons are passed through the tunnel insulating film 8 from the floating electrode 20 and emitted to the channel region at the time of erasing is promoted, and the erase characteristics are improved as compared with the case of the floating electrode formed of strain-less polysilicon. In other words, both the write characteristics and the erase characteristics are improved. As a result, the readout error rate of the memory falls remarkably. Furthermore, since it is not necessary to increase the write voltage and increase the film thickness of the control insulating film, it becomes possible to lower the operation voltage (power dissipation) and make the memory cell finer.

A method for manufacturing the memory element according to the present embodiment differs from the method for manufacturing the memory element according to the first embodiment only in that the two-layer floating electrode having the polysilicon carbon layer 21 and the polysilicon layer 22 formed on the polysilicon carbon layer 21 is formed on the tunnel insulating film 8 instead of the floating electrode formed of single-layer polysilicon.

Fourth Embodiment

A non-volatile semiconductor storage device according to a fourth embodiment of the present invention will now be described with reference to FIG. 18. The non-volatile semiconductor storage device according to the present embodiment has a configuration obtained by replacing the control electrode 14 in the first embodiment with a control electrode formed of polysilicon having extension strain of 0.01% or more.

Figure 18:
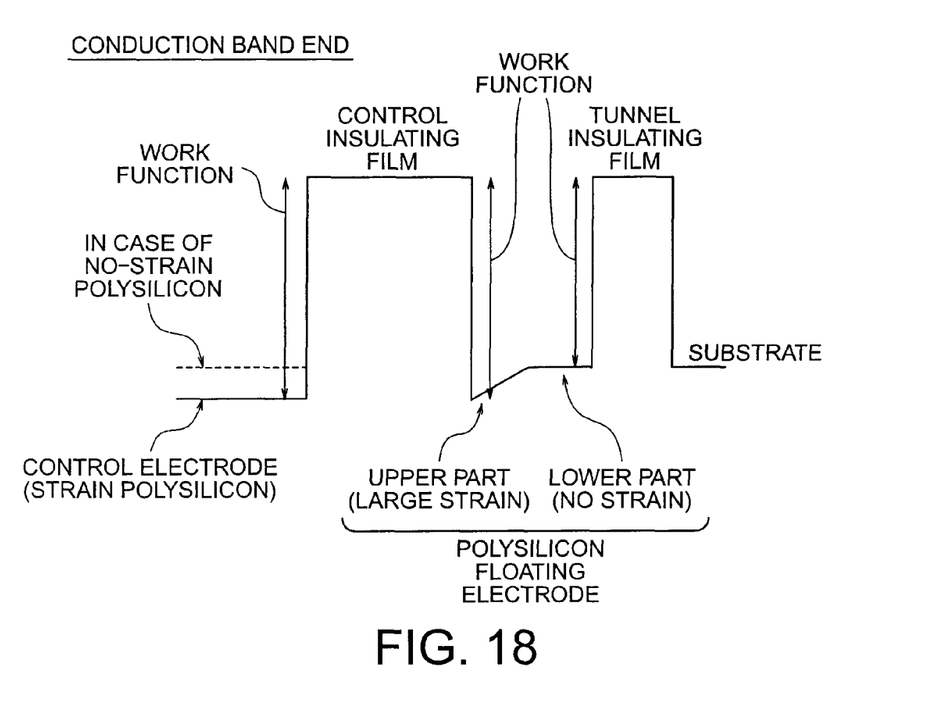
FIG. 18 is a diagram showing conduction band bottom energy in a section of the memory element according to a fourth embodiment in a direction perpendicular to a substrate.

FIG. 18 shows the conduction band bottom energy in a section in a direction perpendicular to the substrate in the memory element according to the present embodiment. As appreciated from FIG. 18, extension strain is applied to the polysilicon layer in the control electrode, and its work function is higher than that of strain-less polysilicon. As compared with the case of the memory element according to the first embodiment, therefore, the tunnel barrier between the control electrode and the control insulating film becomes higher.

As a result, the phenomenon that electrons are passed through the control insulating film from the control electrode and injected into the floating electrode at the time of erasing is suppressed, and the erase characteristics are improved as compared with the case of the memory element according to the first embodiment. In other words, the threshold voltage after the erasing becomes lower. As compared with the memory element according to the first embodiment, therefore, improvement of the memory characteristics can be anticipated.

A method for manufacturing the memory element according to the present embodiment differs from the method for manufacturing the memory element according to the first embodiment only in that germanium ions are injected into the control electrode and the control electrode formed of polysilicon is non-crystallized after the control electrode formed of polysilicon is deposited.

The fourth embodiment has a configuration obtained by replacing the control electrode 14 in the non-volatile semiconductor storage device according to the first embodiment with the control electrode formed of polysilicon having extension strain of 0.01% or more. Alternatively, the fourth embodiment may have a configuration obtained by replacing the control electrode in the non-volatile semiconductor storage device according to the second or third embodiment with the control electrode formed of polysilicon having extension strain of 0.01% or more.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A non-volatile semiconductor storage device comprising a memory element which includes:
   a semiconductor layer;
   a first insulating film formed on the semiconductor layer;
   a floating electrode formed on the first insulating film, and including a polysilicon carbon layer formed on the first insulating film and a polysilicon layer formed on the polysilicon carbon layer, the polysilicon layer and the polysilicon carbon layer are electric charge storing layers;
   a second insulating film formed on the floating electrode; and
   a control electrode formed on the second insulating film.

2. The storage device according to claim 1, wherein a carbon content in the polysilicon carbon layer is in a range of 0.2% to 2%.

3. The storage device according to claim 1, wherein a carbon content in the polysilicon carbon layer is 0.2% or more.

4. The storage device according to claim 1, wherein a carbon content in the polysilicon carbon layer is 2% or less.

5. The storage device according to claim 1, wherein a plurality of the memory elements constitute a NAND cell.

6. The storage device according to claim 1, wherein the semiconductor layer is made of $p^+$-type semiconductor.

7. The storage device according to claim 1, wherein the semiconductor layer is made of $p^+$-type silicon.

8. The storage device according to claim 1, wherein the first insulating film is made of oxide silicon, oxy-nitride silicon, or nitride silicon.

9. The storage device according to claim 1, wherein the second insulating film is made of oxide silicon, oxy-nitride silicon, or nitride silicon.

10. The storage device according to claim 1, wherein the control electrode is made of polysilicon.

11. A non-volatile semiconductor storage device comprising a memory element which includes:
    a semiconductor substrate;
    a source region and a drain region formed in the semiconductor substrate so as to be separated from each other;
    a tunnel insulating film formed between the source region and the drain region, on the semiconductor substrate;
    a floating electrode formed on the tunnel insulating film and including a polysilicon carbon layer formed on the tunnel insulating film and a polysilicon layer formed on the polysilicon carbon layer, the polysilicon layer and the polysilicon carbon layer are electric charge storing layers;
    a control insulating film formed on the floating electrode; and
    a control electrode formed on the control insulating film.

12. The storage device according to claim 11, wherein a carbon content in the polysilicon carbon layer is in a range of 0.2% to 2%.

13. The storage device according to claim 11, wherein a carbon content in the polysilicon carbon layer is 0.2% or more.

14. The storage device according to claim 11, wherein a carbon content in the polysilicon carbon layer is 2% or less.

15. The storage device according to claim 11, wherein a plurality of the memory elements constitute a NAND cell.

16. The storage device according to claim 11, wherein the semiconductor substrate is made of $p^+$-type semiconductor.

17. The storage device according to claim 11, wherein the semiconductor substrate is made of $p^+$-type silicon.

18. The storage device according to claim 11, wherein the tunnel insulating film is made of oxide silicon, oxy-nitride silicon, or nitride silicon.

19. The storage device according to claim 11, wherein the control insulating film is made of oxide silicon, oxy-nitride silicon, or nitride silicon.

20. The storage device according to claim 11, wherein the control electrode is made of polysilicon.

* * * * *